United States Patent [19]

Ben

[11] Patent Number: 4,900,214
[45] Date of Patent: Feb. 13, 1990

[54] METHOD AND APPARATUS FOR TRANSPORTING SEMICONDUCTOR WAFERS

[75] Inventor: Jan I. Ben, Lawrenceville, N.J.

[73] Assignee: American Telephone and Telegraph Company, New York, N.Y.

[21] Appl. No.: 198,347

[22] Filed: May 25, 1988

[51] Int. Cl.$^4$ .............................................. B65G 1/06
[52] U.S. Cl. .................................... 414/416; 414/786;
  294/34; 294/103.1; 901/39; 901/37
[58] Field of Search ............... 294/103.1, 88, 119.1,
  294/103.2, 12, 19.3, 22, 23, 34, 901, 902;
  414/416, 417, 225, 331, 786; 901/31, 36, 39, 37

[56] References Cited

U.S. PATENT DOCUMENTS

| | | | |
|---|---|---|---|
| 1,232,488 | 7/1917 | Brooks | 294/34 |
| 1,606,569 | 11/1926 | Guess | 294/34 |
| 2,002,149 | 5/1935 | Kneeland | 294/34 |
| 2,988,237 | 6/1961 | Devol, Jr. | 901/37 X |
| 2,992,848 | 7/1961 | Livensparger | 294/34 |
| 3,233,750 | 2/1966 | Bannon | 901/36 X |
| 3,648,854 | 3/1972 | Potter | 901/37 X |
| 3,750,804 | 8/1973 | Lemelson | 214/16.4 A |
| 4,002,245 | 1/1977 | Mink | 901/36 X |
| 4,002,254 | 1/1977 | Olofsen | 414/416 |
| 4,266,910 | 5/1981 | Pickard | 414/735 |
| 4,293,268 | 10/1981 | Mink | 901/31 X |
| 4,378,189 | 3/1983 | Takeshita et al. | 414/225 |
| 4,410,209 | 10/1983 | Trapani | 294/34 |
| 4,457,661 | 7/1984 | Flint et al. | 414/404 |
| 4,501,527 | 2/1985 | Jacoby | 414/225 |
| 4,533,033 | 8/1985 | van Wegen | 198/413 |
| 4,553,069 | 11/1985 | Purser | 315/111.81 |
| 4,558,984 | 12/1985 | Garrett | 414/609 |
| 4,595,221 | 6/1986 | de Geus et al. | 294/103.1 |
| 4,616,971 | 10/1986 | Matrone | 414/730 |
| 4,626,013 | 12/1986 | Barrows | 901/39 X |
| 4,639,028 | 1/1987 | Olson | 294/34 |
| 4,685,852 | 8/1987 | Rubin et al. | 414/404 |
| 4,696,501 | 9/1987 | Webb | 294/86.4 |
| 4,699,414 | 10/1987 | Jones | 294/902 X |
| 4,701,096 | 10/1987 | Fisher, Jr. | 414/331 X |

FOREIGN PATENT DOCUMENTS

| | | | |
|---|---|---|---|
| 1293994 | 4/1969 | Fed. Rep. of Germany | 294/103.1 |
| 2420320 | 11/1975 | Fed. Rep. of Germany | 294/34 |
| 2244602 | 5/1975 | France | 901/36 |
| WO80/06566 | 11/1987 | PCT Int'l Appl. | 414/417 |
| 0738867 | 6/1980 | U.S.S.R. | 294/103.1 |
| 1009758 | 4/1983 | U.S.S.R. | 294/103.1 |
| 2171978 | 9/1986 | United Kingdom | 414/416 |

Primary Examiner—Robert J. Spar
Assistant Examiner—Robert S. Katz
Attorney, Agent, or Firm—Robert B. Levy

[57] ABSTRACT

An apparatus for releasably engaging a semiconductor wafer (12) comprises a frame (18) adapted for engagement by a robotic arm (26). The frame mounts one end of an elongated arm (30) dimensioned for insertion into a pocket (14) in a wafer-carrying cassette (16). The arm has a first jaw (34) depending from its end distant from the frame for engaging a portion of the edge of the wafer. A second jaw (38) extends through a slot (46) in the arm so as to be opposite the first jaw for engaging a portion of the edge of the wafer diametrically opposed to that engaged by the first jaw. The second jaw is displaced to and from the first jaw by a pneumatic cylinder (48) to enable the wafer to be releasably captured between the jaws without any damage to the surfaces of the wafer.

7 Claims, 2 Drawing Sheets

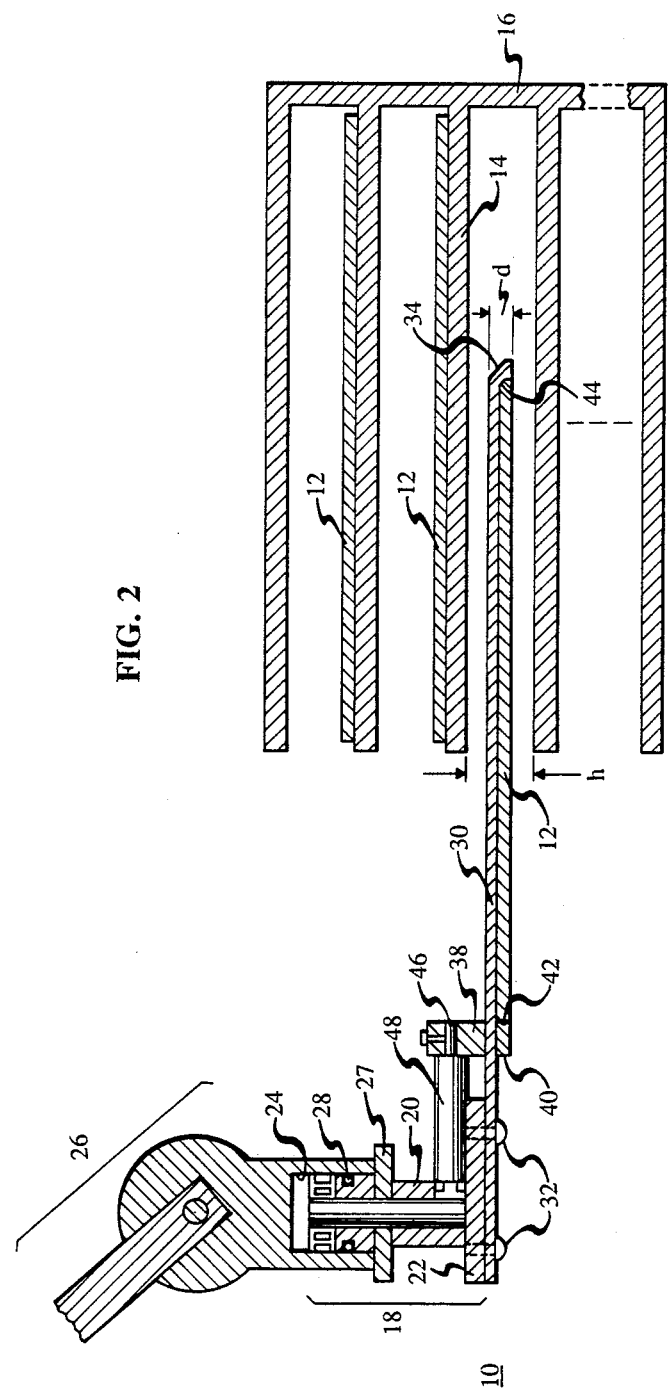

METHOD AND APPARATUS FOR TRANSPORTING SEMICONDUCTOR WAFERS

TECHNICAL FIELD

This invention relates generally to a method and apparatus for transporting a flat, disc-shaped object, such as a semiconductor wafer.

BACKGROUND ART

Present day semiconductor devices are typically produced from a thin wafer of single crystal semiconductor material (e.g., silicon). In order to produce semiconductor devices, each wafer must undergo a series of process steps which are usually carried out on different processing machines located in separate areas of a manufacturing plant. In many manufacturing facilities, wafers are transported between the machines in a wafer-carrying cassette which has a plurality of spaced pockets each sized to receive an individual wafer. Typically, each cassette carries a batch of 25 wafers. Once the cassette arrives at a machine, it is usually necessary to remove individual wafers from the cassette for processing. Rather than rely on a human operator to accomplish this task, most semiconductor processing machines now produced are provided with an automated wafer load and unload system.

Most wafer load and unload systems employ two separate mechanisms in order to remove a wafer from a cassette and transport it to a processing station on the machine. The first of the two mechanisms usually takes the form of a spatula which adapted for insertion into, and withdrawal from, a selected pocket in the cassette to remove or insert a wafer. The second mechanism typically takes the form of a movable vacuum pickup device which serves to transport the wafer between the spatula and the processing station.

The need for two separate mechanisms in order to transport wafers between the cassette and the processing station on the machine makes present day wafer load and unload systems mechanically complex and inefficient. As a result, such systems tend to be relatively slow and expensive. Therefore, there is a need for a simple technique for transporting a semiconductor wafer.

BRIEF SUMMARY OF THE INVENTION

Briefly, in accordance with an aspect of the invention, an apparatus is provided for releasably engaging a semiconductor wafer, especially one stored in a pocket of a wafer-carrying cassette. The apparatus comprises a frame which is typically adapted for engagement by a robot programmed for movement under automatic control. An elongated arm, sized for receipt in a pocket of the wafer cassette, is mounted to the frame and extends a distance therefrom. The arm has a jaw, depending from its end distant from the frame, for engaging a portion of the edge of the wafer. A second jaw is slidably mounted along the underside of the arm of movement to and from the first jaw for engaging a portion of the edge of the wafer opposite to the portion engaged by the first jaw. Means, typically in the form of an air cylinder, are carried by the frame for displacing the second jaw to and from the first jaw to enable the wafer to be releasably captured between the jaws. The first and second jaws each depend from the arm a distance on the order of the thickness of the wafer, which enables the apparatus to pick up wafers from, and place wafers onto, a flat surface, such as a sputtering tray, for example.

In accordance with another aspect of the invention, a method is disclosed for releasably engaging a semiconductor wafer, especially one stored in a pocket in a wafer-carrying cassette. The method is carried out by initially positioning an arm, having a first depending jaw, proximate to the wafer so the jaw lies outside of, and opposite to, the edge of the wafer. When the wafer is seated in one of the pockets of the cassette, the step of positioning the arm is accomplished by inserting the arm into the pocket so as to overly the wafer, and then lowering the arm slightly so the first jaw is opposite to the edge of the wafer. After the arm has been so positioned, a second jaw, which is slidably mounted along the undersurface of the arm, is displaced towards the first jaw. Both jaws typically depend below the arm a distance on the order of the thickness of the wafer.

As may be appreciated, by appropriately positioning the arm, and then displacing the second jaw towards a first jaw, the wafer becomes engaged at opposite points along its edge. In this way, a wafer, especially one stored in a pocket of a cassette or one lying on a flat surface, can be firmly captured without any damage to any features on its major surface. After the wafer is captured, the frame (together with the arm and both jaws) can be displaced by a robot, or similar structure to transport the wafer. Thus, engagement and transport of the wafer can be accomplished in a simple, efficient manner.

BRIEF DESCRIPTION OF THE DRAWINGS

FIG. 2 is a side view, in cross-section, of the apparatus of FIG. 1.

DETAILED DESCRIPTION

Figure 1:
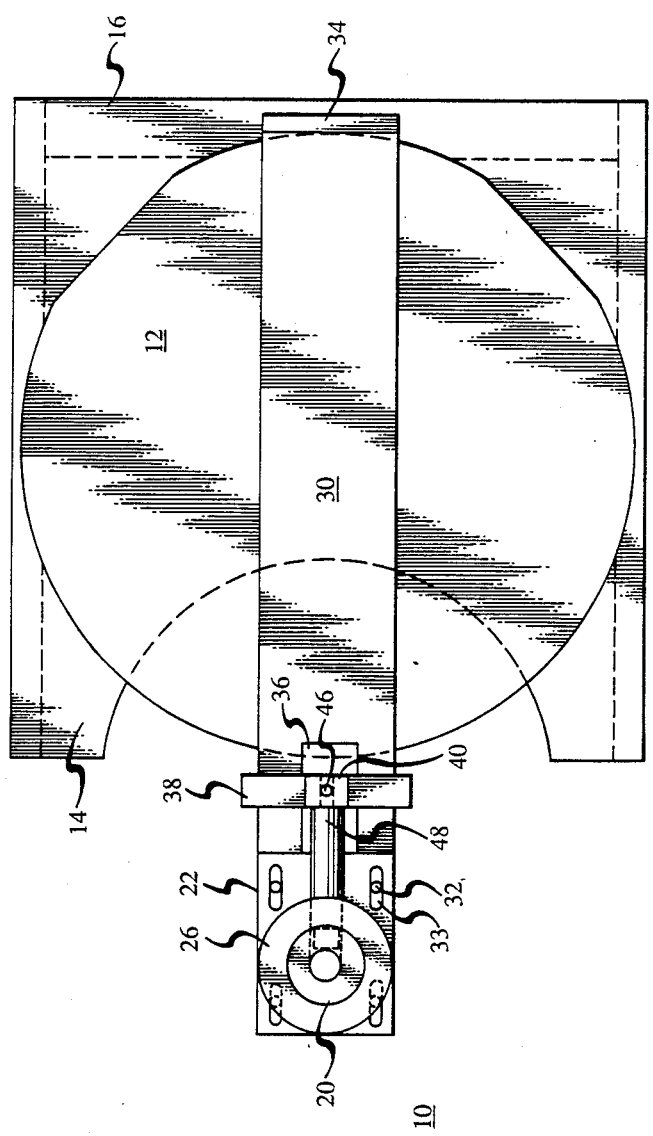
FIG. 1 is a plan view of an apparatus constructed in accordance with the present invention for releasably engaging a semiconductor wafer.

FIGS. 1 and 2 illustrate a plan view and a side view respectively of an apparatus 10 for releasably engaging and transporting a semiconductor wafer 12, especially a wafer stored in one of a set of pockets 14 in a cassette 16. As best seen in FIG. 2, the apparatus 10 is comprised of a frame 19 configured of a hollow, cylindrical tool chuck 20 which has a plate 22 integrated to a first one of the ends thereof so as to be perpendicular to the major axis of the chuck. The tool chuck 20 has a second end, opposite the plate 22, which is sized for receipt in a socket 24 in the end of an robotic arm 26, movable under program control in a well-known fashion. A shoulder 27 is provided about the periphery of the tool chuck 20 a distance below its second end to limit the receipt of the tool chuck into the socket 24. A substantially air-tight seal is provided between the exterior surface of the tool chuck 20 and the wall of the socket 24 by an O-ring 28 embedded into the periphery of that portion of the tool chuck received in the socket.

The apparatus 10 also includes an arm 30 having a first end attached by a set of bolts 32 to the undersurface of the plate 22 so the are extends away from the plate parallel thereto. The length of the arm 30 is chosen to be somewhat greater than the diameter of the largest wafer 12 to be engaged by the apparatus 10. As best seen in FIG. 2, the bolts 32, which secure the arm 30 to the plate 22, each pass through a separate set of elongated openings 33 in the arm. The elongated openings 33 permit the distance from the end of the arm 30 to the frame 18 to be adjusted, which, as will become better understood hereinafter, allows different size wafers to be engaged by the apparatus 12.

At the end of the arm 30 opposite the end attached to the plate 22, there is a jaw 34. Typically, the jaw 34 is integral with the arm 30 and depends therefrom a distance on the order of the thickness of the wafer 12. The arm 30 and the jaw 34 have a combined thickness d which is chosen to be smaller than the height h of the opening into each of the pockets 14 in the cassette 16. In this way, the arm 30 can be inserted into the pocket 14 without interference.

Referring to FIG. 1, the arm 30 is provided with a generally rectangular slot 36 which runs from the end of the plate 22 towards the jaw 34. Overlying a portion of the slot 36 is a block 38, which, as seen in FIG. 2, has a depending jaw 40 sized to extend through the slot for movement therein. Like the jaw 34, the jaw 40 depends below the arm 30 a distance on the order of the thickness of the wafer 12. The jaw 40 is provided with a wafer-engaging face 42 thereon which is directly opposite to a wafer-engaging face 44 provided on the jaw 34. The wafer-engaging faces 42 and 44 on the jaws 38 and 34, respectively, are designed to engage portions of the edge of the wafer 12 which are diametrically opposite each other.

The block 38 is secured to the end of a shaft 46 which is actuated by a spring-return actuator 48, typically a pneumatic cylinder, mounted on the plate 22. When compressed air in admitted into the pneumatic cylinder 48, typically through the robot arm 26 and the tool chuck 20, the shaft 46 is displaced outwardly from the cylinder parallel to the major axis to the arm 30. As a result, the jaw 40 is displaced towards the jaw 34 to capture the wafer 12 therebetween. The spring-action of the pneumatic cylinder 48 causes the shaft 46 to be retracted into the cylinder once the flow of compressed air has been interrupted thereby releasing the engaged wafer 12. Rather than employ the pneumatic cylinder 48, other types of spring return actuators, such as an electric solenoid, could be employed.

To remove the wafer 12 from a selected pocket 14 in the cassette 16, the robotic arm 26 first displaces the apparatus 10 to insert the arm 30 into the pocket so the portion of the arm lying between the jaws 34 and 40 completely overlies the wafer. At this time both of the jaws 34 and 40 lie outside the periphery of the wafer 12. Next, the robot arm 26 is displaced to lower the arm 30 so that the jaws 34 and 40 now lie in substantially the same plane as the wafer. Thereafter, the compressed air is admitted through the tool chuck 20 and into the pneumatic cylinder 48 so the pneumatic cylinder displaces the jaw 40 towards the jaw 34. As a result, the faces 42 and 44 on the jaws 40 and 34 each engage a portion of the edge of the wafer diametrically opposite to that engaged by the other face on the other jaw.

While the pneumatic cylinder 48 remains pressurized, the wafer 12 remains engaged by the jaws 34 and 40, allowing the robot arm to remove the arm 30 from the pocket 14, and thereby remove the wafer from the cassette carrier 16. Following removal of the wafer 12 from the cassette carrier 16, the robot arm 26 is displaced to transport the engaged wafer to a location where it is to be offloaded. It may be that the wafer 12 is to be off-loaded in the pocket of another cassette (not shown), in which case, the robot arm 26 is displaced to insert the arm 30 into the cassette pocket which is to receive the wafer. Once the wafer 12 has been transported to the location where it is to be off-loaded, the flow of compressed air into the pneumatic cylinder 48 is interrupted, causing the jaw 40 to move away from the jaw 34, thereby releasing the wafer.

A distinct advantage of the apparatus 10 is that it can enter one of the pockets 14 in the cassette carrier 16 and releasably engage the wager 12 without contacting either of the surfaces of the wafer, the active one of which typically contains delicate features. The engagement of the wafer 12 by the apparatus 10 is sufficiently firm to allow the apparatus to be displaced by the robotic arm 26 in almost any orientation without risking possible disengagement of the wafer. Thus, for example, the apparatus 10 can be displaced by the robotic arm 26 to withdraw a wafer 12 stored horizontally in the cassette 16 and then unload the wafer in a pocket on a vertical wall of a susceptor (not shown).

Another distinct advantage of the apparatus 10 is its ability to pick up a wafer 12, seated on a flat surface, as well as to place a wafer engaged by the arm onto a flat surface. The ability of the apparatus 10 to accomplish these tasks is due, in part, to the fact that the jaws 34 and 40 depend below the arm 30 a distance on the order of the thickness of the wafer.

It is to be understood that the that the above-described embodiments are merely illustrative of the principles of the invention. Various modifications and changes may be made thereto by those skilled in the art which will embody the principles of the invention and fall within the spirit and scope thereof.

What is claimed is:

1. A method for releasably engaging a wafer, characterized in that:
    an elongated arm, having a depending first jaw, is positioned above the wafer so that the first jaw lies outside the edge of the wafer;
    the arm is lowered so that the first jaw is opposite to a portion of the edge of a wafer; and
    a second jaw slidably mounted in a longitudinal slot which extends through the arm so as to have an upper portion above said arm, to extend through the slot and have a jaw portion depend below the arm, is displaced by a fluid cylinder connected between a frame and said upper portion, causing the second jaw to move in the slot and said depending jaw portion to move along the underside of the arm towards the first jaw so that the wafer is engaged by, and is captured between, the jaws.

2. The method according to claim 1, characterized in that:
    the wafer is stored in a pocket of a wafer cassette carrier; and
    the arm is positioned above the wafer by inserting the arm into the pocket in the cassette carrier where the wafer is stored.

3. The method according to claim 1, characterized in that:
    the wafer, once engaged, is transported by displacing the arm; and thereafter
    the wafer is released by displacing the second jaw away from the first jaw.

4. Apparatus for releasably engaging a wafer, characterized by:
    a frame;
    an elongated arm mounted to said frame and extending outwardly therefrom, said arm having a longitudinally extending slot which extends therethrough;

a first jaw depending from said arm at a point distant from said frame, said first jaw adapted to engage a portion of the edge of the wafer;

a second jaw extending entirely through said slot so as to extend above said arm and having a jaw portion depending below said arm, said second jaw slidably mounted for movement in the slot with said depending jaw portion movable along the underside of said arm to and from the first jaw for engaging a portion of the edge of the wafer opposite to the portion engaged by said first jaw; and fluid cylinder means connected between said frame and said portion of said second jaw which extends above said arm for displacing said second depending jaw portion towards said first jaw to capture the wafer therebetween.

5. The apparatus according to claim 4, characterized in that said arm is dimensioned for insertion into a pocket in a cassette containing a wafer to be engaged.

6. The apparatus according to claim 4, characterized in that said frame includes:

a cylindrical tool chuck having a first end and second end, the first end being dimensioned for engagement by a robot; and a plate secured to a second end of the tool chuck for adjustably mounting the arm.

7. The apparatus according to claim 4, characterized in that said means for displacing the second depending jaw portion comprises a pneumatic cylinder.

* * * * *